(12) United States Patent
Takasu

(10) Patent No.: US 6,884,701 B2
(45) Date of Patent: *Apr. 26, 2005

(54) PROCESS FOR FABRICATING SEMICONDUCTOR DEVICE

(76) Inventor: Hidemi Takasu, c/o Rohm Co., Ltd., 21, Saiin Mizosaki-cho, Ukyo-ku, Kyoto-shi, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,915

(22) Filed: Dec. 16, 1998

(65) Prior Publication Data

US 2001/0046754 A1 Nov. 29, 2001

Related U.S. Application Data

(63) Continuation-in-part of application No. 09/026,097, filed on Feb. 19, 1998, now abandoned, which is a division of application No. 08/200,312, filed on Feb. 23, 1994, which is a continuation of application No. 07/804,237, filed on Dec. 5, 1991, now abandoned.

(51) Int. Cl.[7] .......................... H01L 21/20; H01L 21/36
(52) U.S. Cl. ...................... 438/506; 438/526; 438/906; 438/907; 438/913
(58) Field of Search ................................ 438/506, 526, 438/906, 913, FOR 251, 907

(56) References Cited

U.S. PATENT DOCUMENTS

| | | | |
|---|---|---|---|
| 3,895,965 A | * | 7/1975 | MacRae et al. |
| 4,202,002 A | | 5/1980 | De La Moneda |
| 4,214,315 A | | 7/1980 | Anantha et al. |
| 4,216,574 A | | 8/1980 | Feist |
| 4,241,359 A | | 12/1980 | Izumi et al. |
| 4,261,763 A | * | 4/1981 | Kumar et al. |
| 4,295,898 A | * | 10/1981 | Yoshida et al. |
| 4,376,664 A | | 3/1983 | Hataishi et al. |
| 4,704,302 A | | 11/1987 | Bruel et al. |
| 5,166,083 A | * | 11/1992 | Bayraktaroglu ...... 148/DIG. 72 |
| 5,403,434 A | * | 4/1995 | Moslehi |
| 6,007,624 A | * | 12/1999 | Wise |

FOREIGN PATENT DOCUMENTS

| | | | |
|---|---|---|---|
| JP | 5927521 A | * | 2/1984 |
| JP | 63261833 A | * | 10/1988 |

OTHER PUBLICATIONS

Translation of Japanese Patent No. 63–261833, "Manufacture of Semiconductor Substrate" by Chikara Yamaguchi, et al. PTO 96–0835.*

Wolf, S., et al., Silicon Processing for the VLSI Era: vol. 1, Process Technology, 1986 by Lattice Press, p. 133–136, 303–308 and 321–322.*

* cited by examiner

Primary Examiner—George Fourson
Assistant Examiner—Michelle Estrada
(74) Attorney, Agent, or Firm—Baker Botts LLP

(57) ABSTRACT

A process for fabricating a semiconductor device having a buried layer comprises the steps of implanting an impurity ion into where the buried layer to be formed in a substrate, providing the substrate inside a reactor furnace, preparing a nonoxidizing atmosphere inside of the reactor furnace, annealing the substrate to activate and diffuse the implanted impurity ion region while increasing inside temperature of the reactor furnace up to a first temperature, and shifting the inside temperature of the reactor furnace from the first temperature to a second temperature in which a epitaxial crystal starts to grow and introducing a epitaxial growth gas into the reactor furnace to grow an epitaxial layer on a surface of the substrate.

8 Claims, 6 Drawing Sheets

DEPTH FROM SURFACE OF SUBSTRATE

DEPTH FROM SURFACE OF SUBSTRATE

PROCESS FOR FABRICATING SEMICONDUCTOR DEVICE

"This is a continuation-in-part of application Ser. No. 09/026,097 filed Feb. 19, 1998 now abandoned which is a divisional of Ser. No. 08/200,312 filed Feb. 23, 1994 which is a continuation of Ser. No. 07/804,237 filed Dec. 5, 1991 now abandoned."

BACKGROUND OF THE INVENTION

The present invention relates to processes for fabricating semiconductor devices and, more particularly, to a semiconductor fabrication process in which a buried layer is formed.

In semiconductor devices such as semiconductor integrated circuits, a $p^+$ buried layer is provided for the application of an "up-down isolation" technique. In up-down isolation, an region is not only diffused downwardly from the surface of an epitaxial layer but also is rediffused upwardly from below the epitaxial layer, i.e., from the substrate side. With this technique, the diffusion time is shortened so as to suppress the lateral spread of the isolation (p-diffusion). Accordingly, the chip area can be reduced and, at the same time, the breakdown voltage of the completed semiconductor device is increased because of limited upward diffusion of the $n^+$ region.

Taking an npn transistor as an example of a semiconductor device having a buried layer, a first related process sequence for forming the buried layer in this transistor is described hereinafter with reference to FIGS. 1 through 4. In step 1 shown in FIG. 1, a p-type substrate 11 typically made of silicon is provided with an oxide film mask 12, such as an $SiO_2$, film, arranged so that the surface of the substrate 11 is exposed in a region where the buried layer is to be formed. The surface of the region of the substrate 11 which is not covered with the mask 12 may be referred to as a window W.

In the next step 2 shown in FIG. 2, the substrate 11 is put into a diffusion furnace, and ions of a p-type impurity such as boron (B) are implanted into the substrate 11 through the window W to form an ion-implanted region 13 in the substrate 11.

In step 3 shown in FIG. 3, the entire substrate 11 is heated to a temperature of about 800 to 1300° C. in an oxidizing atmosphere such as dry oxygen or water vapor. Through the annealing process, the p-type impurity is activated and diffused into the substrate 1 form a $p^+$ diffusion region 14' beneath the window W. During this diffusion, an oxide film 15, such as an $SiO_2$, film, is also formed in the window W of the substrate 11.

In step 4 shown in FIG. 4, the $SiO_2$ mask 12 and the oxide film 15 are removed to expose the $p^+$ diffusion region 14' in the window W, so that a $p^+$ buried layer 14 is formed. Upon removal of the oxide film 15, a step 14a will form at the edge of the $p^+$ buried layer 14 which corresponds to the periphery of the window W.

The thus fabricated semiconductor is subjected to the further treatment to provide an npn transistor. For example, the substrate 11 is put in an epitaxial growth furnace, an epitaxial layer 16 is grown on the surface of the substrate 11 as in step 5 in FIG. 5.

FIG. 6 is a graphical representation of impurity concentration distribution profiles in the respective steps in the process of fabricating the buried layer. In the graph, the abscissa represents depth measured from the surface of the substrate, and the ordinate, impurity concentration. In the graph, "a" is an impurity concentration distribution when impurity ions are implanted in the step 2. In the step 3, the impurity region is expanded to profile an impurity concentration distribution indicated by "b". In the step 4, the impurity is further diffused to form a profile of an impurity concentration distribution indicated by "c". By etching process, the surface of the substrate surface is lowered to a level indicated by $z_0$.

In the fabrication process, the impurity diffusion caused by the heat treatment in the gas etching process reaches the substrate surface. Therefore, if the substrate is subjected to the epitaxial growing process, an undesirable phenomenon of autodoping from the buried layer 14 to the epitaxial layer 16 occurs as shown in FIG. 7. In the figure, character "$z_0$" indicates an interface between the epitaxial layer 16 and the $p^+$ buried layer 14.

In the related process sequence described above, the buried layer 14 is formed by first performing ion implantation in step 2 (FIG. 2), then heating the substrate in step 3 (FIG. 3). However, the ion implantation performed in step 2 will cause significant damage to the surface of the substrate 11 in the window W. If the substrate is heated in the next step 3 to form the $p^+$ diffusion region 14' without repairing the surface damage, surface defects will appear in the $p^+$ buried layer 14 when it is formed by exposing the $p^+$ diffusion region 14' in step 4 (FIG. 8). This is undesired from a practical viewpoint since those surface defects will lead to structural defects in the final transistor device.

In the related semiconductor fabrication process, the substrate is annealed in an oxidizing atmosphere. This sometimes gives rise of crystal defects, e.g., OSF (oxide-induced stacking fault), in the substrate surface. In case where an epitaxial layer is formed on the substrate surface suffering from crystal defects, the resultant epitaxial layer is deteriorated in its film quality since it is adversely affected by the crystal defects. As a result, the final transistor device as a product suffers from structural defects.

Also in the related fabrication process, the furnace used by the annealing step is different from that by the epitaxial growing step. Therefore, the substrate undergoes a temperature variation cycle of temperature rise and fall (up to room temperature), which takes place when it is taken out of a furnace and put into another furnace. The thermal stress, which is caused in the substrate at this time, becomes a factor to cause crystal defects in the substrate. The epitaxial layer grows while orientating crystal axis thereof with that at the substrate surface. A surface state of the substrate before the epitaxial layer growing process step starts, greatly affects the film quality of the growing layer.

The temperature variation cycle possibly causes elongation of the fabricating time and unnecessary complexity of the fabrication process.

A second related process of fabricating a semiconductor device in which the annealing step 3 in the semiconductor fabrication process mentioned above is executed by use of the energy beam, is disclosed in Unexamined Japanese Patent Publication No. Sho. 57-106046. The other fabricating steps than the annealing step are substantially the same as in the above-mentioned fabrication process. The unique feature of the fabrication process of the publication resides in that the impurity is activated without greatly varying the impurity concentration distributions profiled after the ion implantation. In this fabrication process, the impurity concentration distributions in the respective fabricating steps are profiled as shown in FIG. 8. In the figure, "a" is an impurity concentration distribution profile after the ion implantation;

"b" is an impurity concentration distribution profile after the annealing; and "c" is an impurity concentration distribution profile after the gas etching. An impurity concentration is distributed, as shown in FIG. 9, in the substrate after the epitaxial growing step ends.

Where this fabrication process is used, no autodoping problem arises, but the crystal defects, e.g., OSF, induced in the annealing step performed in the oxidizing atmosphere inevitably occurs. In this respect, the problems arising from the crystal defects remain unsolved. Additionally, the substrate temperature inevitably varies when the substrate is taken out of the furnace and put into another furnace in the transient period from the annealing step to the epitaxial growing step. Therefore, the substrate surface serving as the epitaxial growing surface is thermally stressed, viz., the thermal stress problem remains unsolved.

SUMMARY OF THE INVENTION

Accordingly, an object of the present invention is to provide a process for fabricating a semiconductor device by which a buried layer free from any surface defects can be prepared in a substrate in such a way that autodoping will not occur in the surface of the surface in a region where an epitaxial layer is to be formed.

To achieve the above object, there is provided a process of fabricating a semiconductor device comprising the steps of: implanting an impurity ion into where the buried layer to be formed in a substrate; providing the substrate inside a reactor furnace; preparing a nonoxidizing atmosphere inside of the reactor furnace; annealing the substrate to activate and diffuse the implanted impurity ion region while increasing inside temperature of the reactor furnace up to a first temperature; and shifting the inside temperature of the reactor furnace from the first temperature to a second temperature in which a epitaxial crystal starts to grow and introducing a epitaxial growth gas into the reactor furnace to grow an epitaxial layer on a surface of the substrate.

In the fabrication process thus constructed, the annealing step, which follows the ion implantation step, is carried out in a nonoxidizing atmosphere in the furnace. Therefore, there is no chance that crystal defects, e.g., OSF (oxide-induced stacking fault) are caused in the substrate surface. Further, no oxidization takes place, so that the oxide film 15 (FIG. 3) is not formed on the substrate surface in the process of the invention. Hence, the step to remove the oxide film may be omitted.

The sequence of process steps is executed within one furnace. Therefore, there is no chance that the substrate undergoes the temperature variation cycle of temperature rise and fall (up to room temperature), which essentially occurs when the substrate is taken out of a furnace and put into another furnace in the related process. Therefore, the fabricating process of the invention is capable of preventing the crystal defects caused by the thermal stress. Further, there is no need of reducing the temperature to room temperature during the process being executed. As a result, the fabricating time is remarkably reduced and the fabricating process is simplified.

The epitaxial growing step starts before the impurity implanted region to be diffused reaches the surface of the substrate.

With this unique feature, the expansion of the impurity ion diffusion region does not reach the interface between the epitaxial layer and the substrate, and hence no autodoping problem arises. Therefore, there is a less chance of forming crystal defects in the epitaxial growing process.

The process procedure subsequent to the step of growing the epitaxial layer may be the corresponding one in the related process, and through the related process procedure, the semiconductor having the buried layer is fabricated into a completed semiconductor device.

DETAILED DESCRIPTION OF THE PREFERRED EMBODIMENTS

A process of fabricating a semiconductor device which is constructed according to the present invention will be described with reference to the accompanying drawings. In the description to be given hereunder, an npn transistor, which was used in the background art description, will be used as the semiconductor device to be fabricated by the fabrication process of the invention for clarifying the invention in comparison with the background art.

FIGS. 10 through 13 cooperate to show a sequence of process steps (first to fourth steps) to fabricate a buried layer in a process of fabricating a semiconductor device which is a first embodiment of the present invention. FIG. 14 is a graphical representation showing a variation of temperature in a reactor furnace with respect to time.

Figure 1:
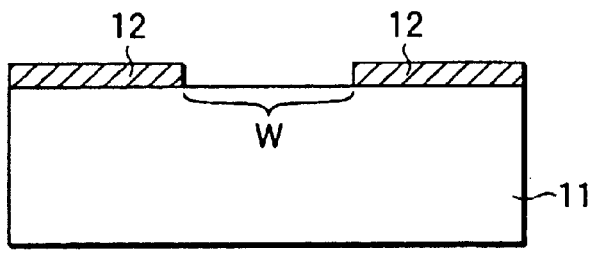
FIG. 1 is a schematic diagram showing a preparatory step of the process sequence in a first related process for fabricating a semiconductor device.
Figure 2:
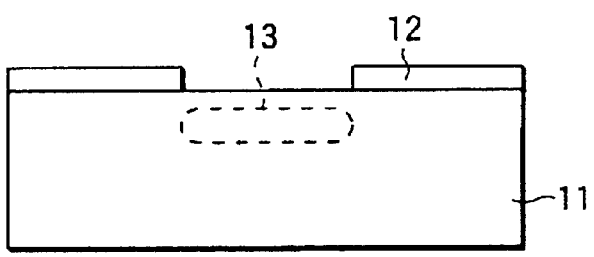
FIG. 2 is a schematic diagram showing an ion implantation step of the first related process sequence.
Figure 3:
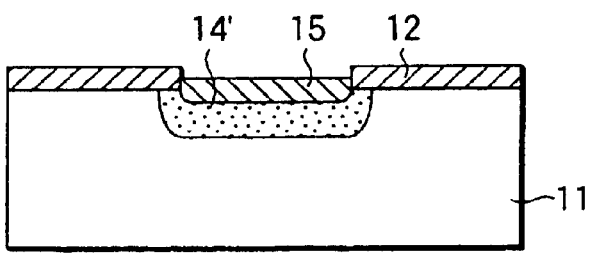
FIG. 3 is a schematic diagram showing an annealing step of the first related process sequence.
Figure 4:
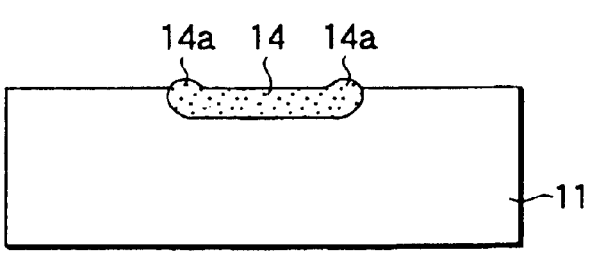
FIG. 4 is a schematic diagram showing an etching step of the first related process sequence.
Figure 5:
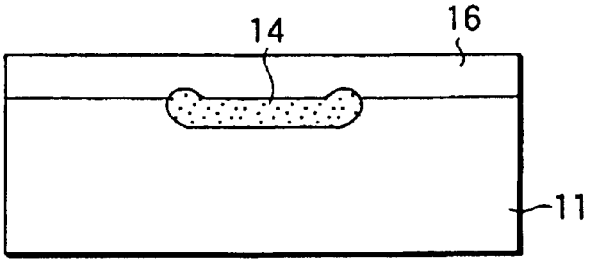
FIG. 5 is a schematic diagram showing an epitaxial growing step of the first related process sequence.
Figure 6:
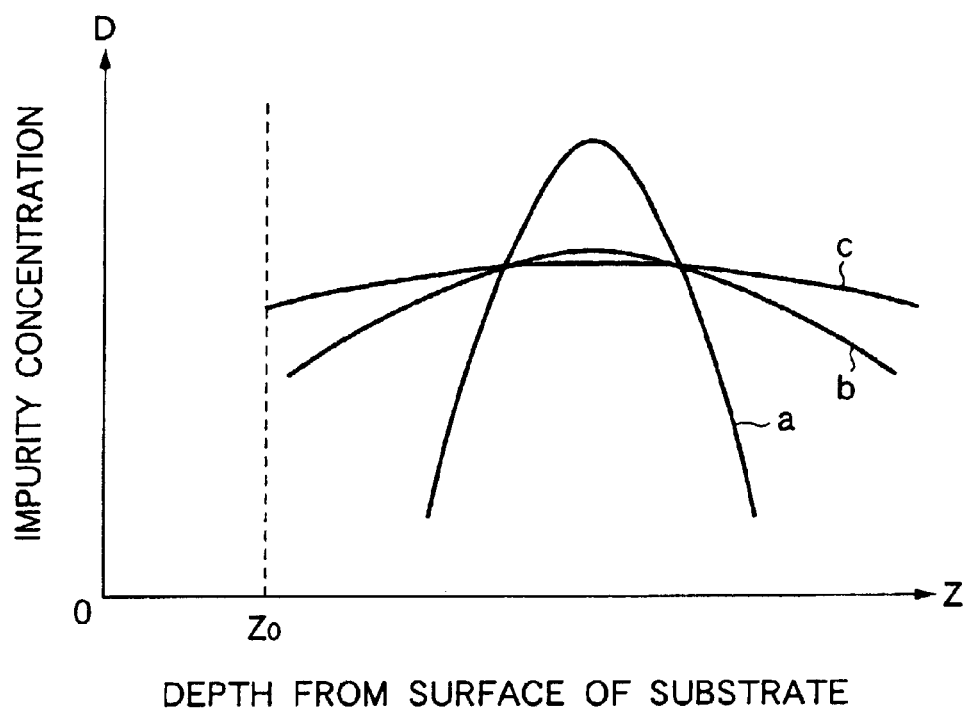
FIG. 6 is a graphical representation showing impurity concentration distribution profiles in the respective steps of the first related process sequence.
Figure 7:
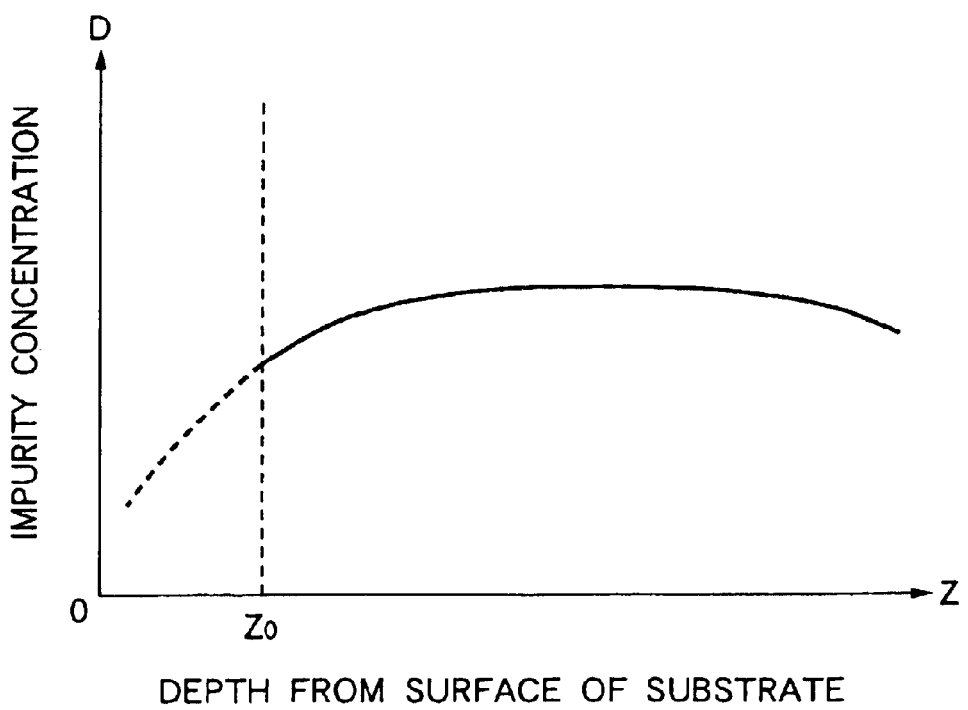
FIG. 7 is a graphical representation showing an impurity concentration distribution profile in the substrate after the epitaxial layer is formed by the first related process sequence.
Figure 8:
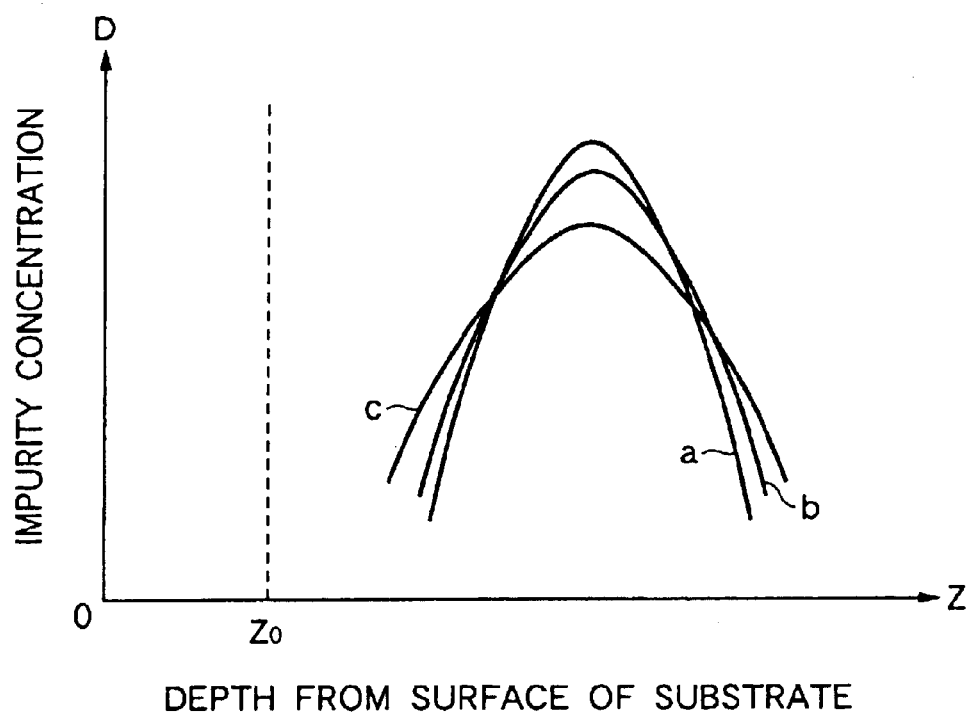
FIG. 8 is a graphical representation showing impurity concentration distribution profiles in the respective steps a second related process of fabricating a semiconductor device.
Figure 9:
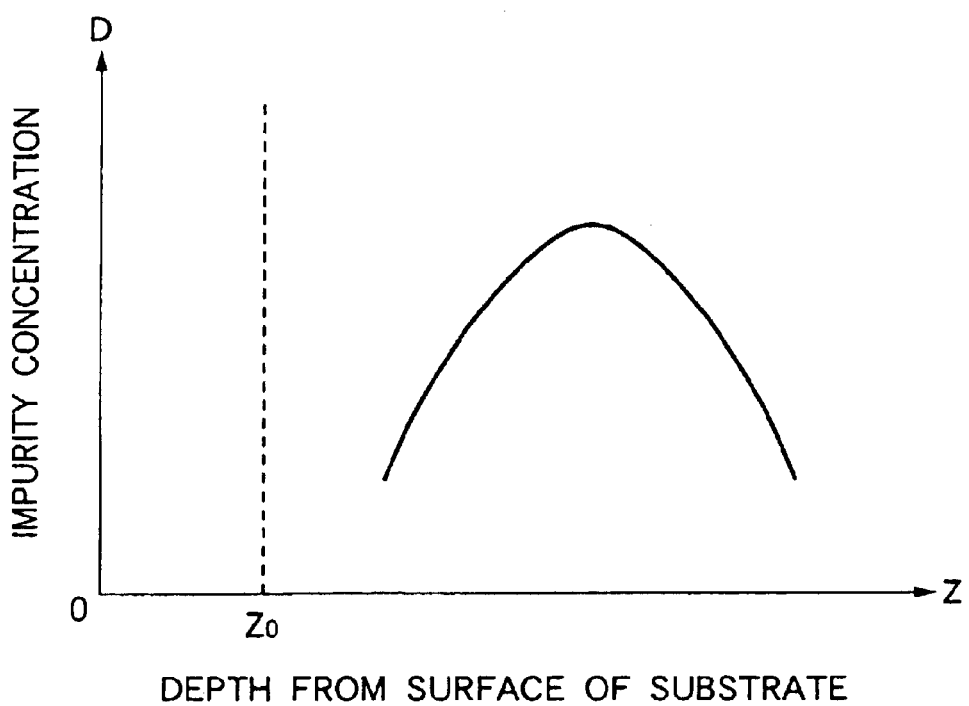
FIG. 9 is a graphical representation showing an impurity concentration distribution profile in the substrate after the epitaxial layer is formed by the second related semiconductor fabrication process.
Figure 10:
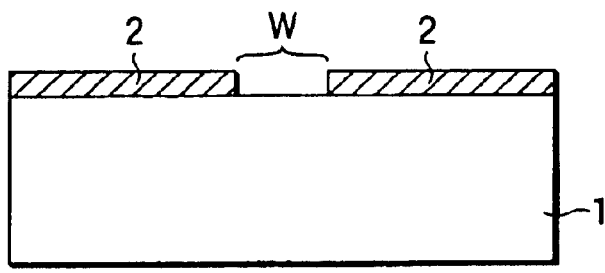
FIG. 10 is a schematic diagram showing a preparatory step of the process sequence in a process for fabricating a semiconductor device according to the present invention.

As shown in FIG. 10, resist 2 is formed over a surface of a p-type substrate 1, typically made of silicon, in a state that the substrate surface is exposed in a region where a $p^+$ buried layer is to be formed. The surface of the region of the substrate 1, not covered with the resist 2, will be referred to as a window W. An $SiO_2$ film may be formed on the p-type substrate 1; actually an $SiO_2$ film, about 1000 Å thick, is formed on the p-type substrate 1. Use of the $SiO_2$ film substantially protects the substrate surface against damage.

Figure 11:
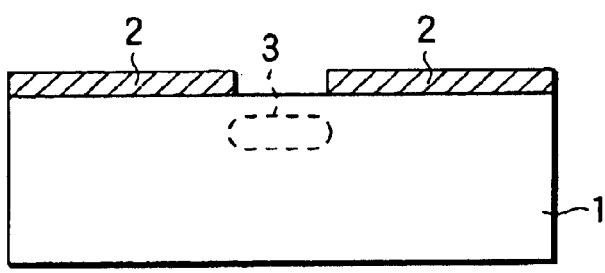
FIG. 11 is a schematic diagram showing an ion implantation step of the same process sequence.

As shown in FIG. 11, ions of a p-type impurity, e.g., boron (B), are implanted into the substrate 1 through the window W to form an ion-implanted region ($p^+$ region) 3 in the substrate 1. The impurity to be ion implanted may be any material, e.g., aluminum (Al), if its conductivity is of the p type since it is used for forming the $p^+$ buried layer.

Figure 12:
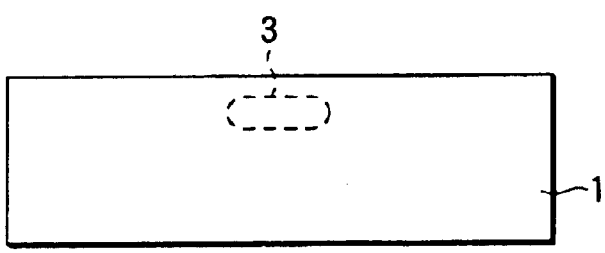
FIG. 12 is a schematic diagram showing a resist removal step of the same process sequence.

In a step shown in FIG. 12, the resist 2 is removed. Before proceeding to the next step 4, the substrate 1 is chemically cleaned and charged into an epitaxial growth furnace (reactor furnace). Any $SiO_2$ film should be etched away prior to the start of epitaxial growth.

Figure 13:
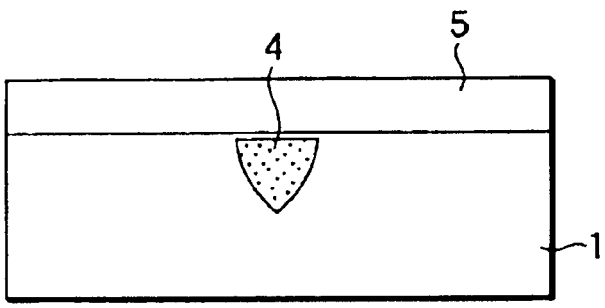
FIG. 13 is a schematic diagram useful in explaining a semiconductor device fabricated by the fabrication process of the invention.
Figure 14:
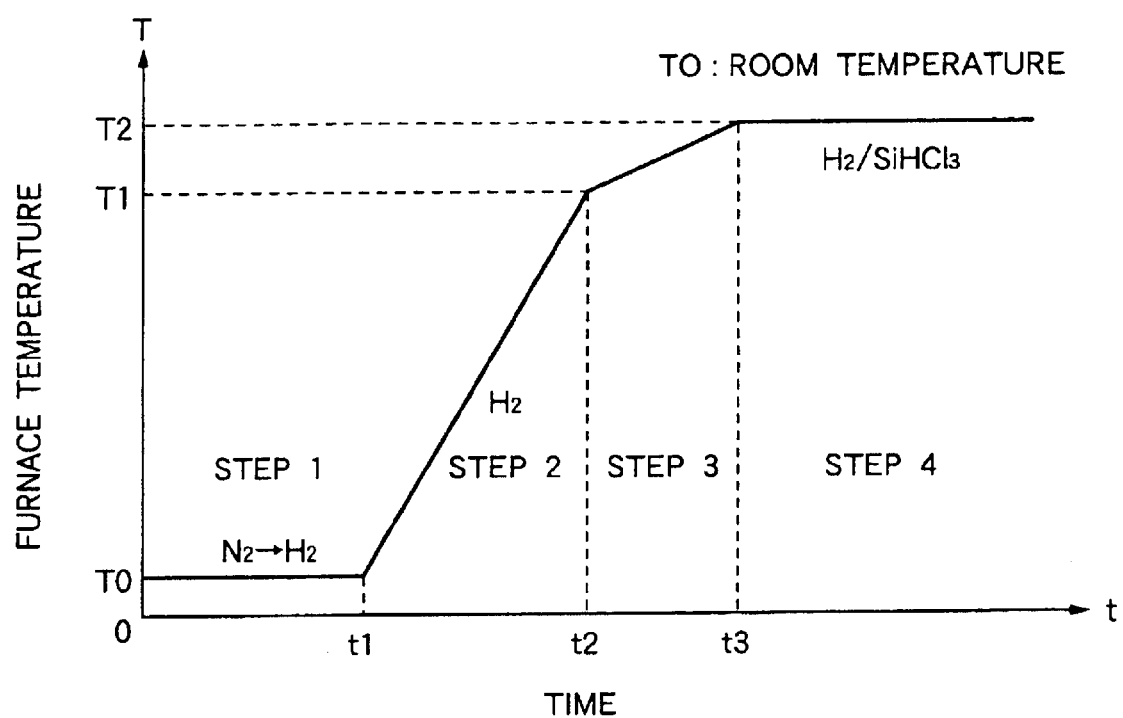
FIG. 14 is a graphical representation showing a variation of temperature in a reactor furnace in a semiconductor fabrication process which is a first embodiment of the present invention.

In a step shown in FIG. 13, the epitaxial growth furnace is purged of oxygen by replacement with $N_2$ gas. Then $H_2$ gas is introduced into the growth furnace while $N_2$ gas is vented to achieve 100% replacement of $H_2$ gas for $N_2$ gas. As a result, the growth furnace is completely filled with $H_2$ gas to create a nonoxidizing atmosphere (step 1, FIG. 14).

As shown in FIG. 14, the temperature within the growth furnace is increased up to T1, while at the same time, in the $H_2$ gas atmosphere, the substrate 1 is annealed to activate and diffuse the implanted boron irons simultaneously (step 2). In this case, it is essential to control temperature and time for the boron ion diffusion so that the impurity diffusion region ($p^+$ region) 3 does not reach the substrate surface. In other words, such an activation of the substrate 1 as to such an extent that the implanted boron irons enter lattice points suffices.

The step (step 2) to form a $p^+$ buried layer 4 is stopped at a time point t2 where the $p^+$ region 3 does not yet reach the window W at the surface of the substrate 1; thereafter as shown in FIG. 14, the temperature in the growth furnace is further increased up to a temperature T2 (T2>T1) at which temperature crystallization will take place; and mixture gas of $H_2$ gas and $SiHCl_3$ gas is introduced into the furnace to grow an epitaxial layer 5 on the substrate 1 (step 3). At the time, T2 may be adjusted to 1000 to 1150° C., and T1 may be adjusted to 100° C. of lower than T2. In addition, it is important that the temperature shifting from T1 to T2 should be executed slowly. Other examples of gas to be mixed with the $H_2$ gas in the epitaxial growing step are $SiH_2Cl_2$, $SiCl_4$, $SiH_4$, etc. At the time T2 with respect to each material gas may be adjusted to 900 to 1120° C., 1100 to 1200° C. and 800 to 1000° C., respectively. T1 may be adjusted to approximately 100° C. of lower than respective T2. And it is required that the temperature T1 is selected such that the impurity ion can be activated sufficiently.

The semiconductor thus provided with the $p^+$ buried layer 4 may be completed as an npn transistor by following the further related procedures for semiconductor fabrication.

A semiconductor fabrication process which is a second embodiment of the present invention will be described. The semiconductor fabrication process of this embodiment is characterized in that an additional step of etching gas is introduced into the furnace to clean the substrate surface is executed before the epitaxial growing step.

Figure 15:
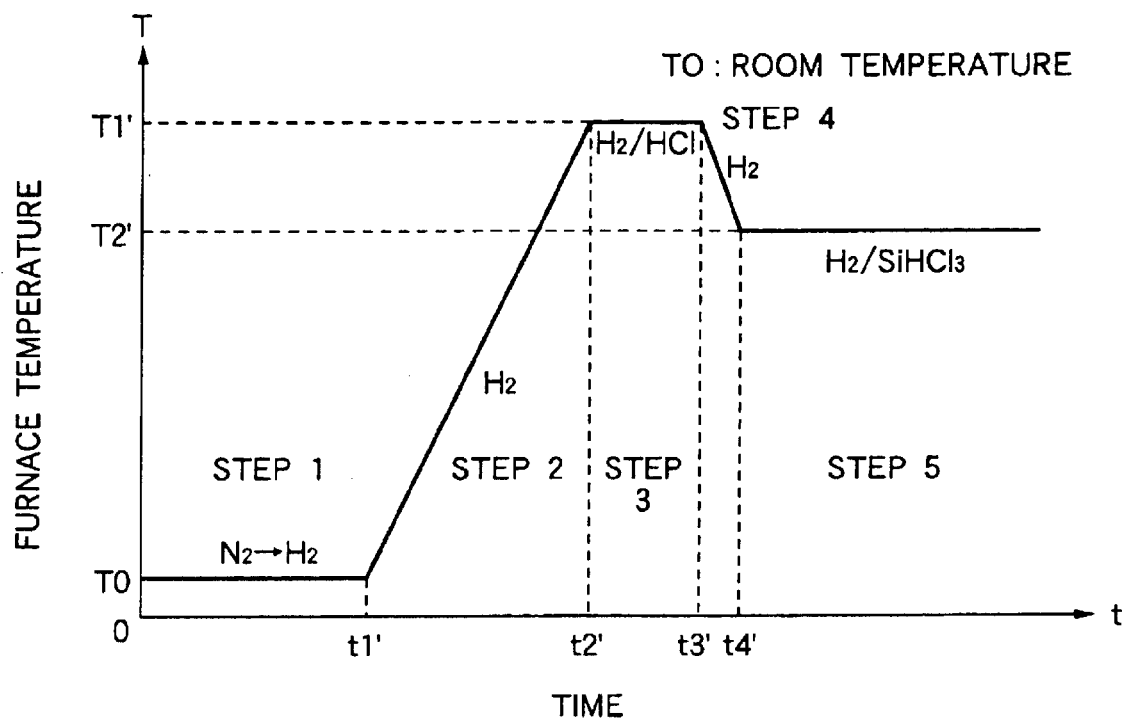
FIG. 15 is a graphical representation showing a variation of temperature in the reactor furnace in the semiconductor fabrication process which is a second embodiment of the present invention.

FIG. 15 is a graphical representation showing a variation of temperature in the reactor furnace in the semiconductor fabrication process of the second embodiment of the present invention. In this embodiment, as in the first embodiment, a nonoxidizing atmosphere is prepared (step 1), and the substrate is annealed while gradually increasing a temperature within the furnace up to temperature T1' (step 2). The step 2 is ended at a time point t2' when the $p^+$ region 3 does not yet reach the window W at the surface of the substrate 1. Thereafter, small amount of HCl gas is mixed with $H_2$ gas in the furnace, and cleaning and etching process is carried out (step 3). The cleaning gas may be consisted of only $H_2$ gas. In this case, the etching depth is set at about 1000 Å. At this time, care must be taken in doing this so that the $p^+$ region 3 will not become exposed on the surface of the substrate 1 by this etching step. At a time point t3', $H_2$ gas is introduced into the furnace to replace the etching gas with the $H_2$ gas, and the temperature in the furnace is decreased to a temperature T2' (T2'<T1') of epitaxial crystallization (step 4). This operation of lowering temperature in the furnace is also effective to suppress unnecessary expansion of the impurity diffusion region. Mixture gas of $H_2$ gas and $SiHCl_3$ gas is introduced into the furnace to grow an epitaxial layer 5 on the substrate 1. At the time, T1' is adjusted to 1140 to 1160° C., preferably to 1150° C.±several degrees. T2' is adjusted to 1100 to 1150° C. in the condition of T2'<T1'. $SiCl_4$, $SiH_2Cl_2$ and $SiH_4$ gases may be served as the gas to be mixed with the $H_2$ gas. In such case, T2' is adjusted to higher than 1100° C. in the condition of T2'<T1', 900 to 1120° C., 800 to 1000° C., respectively.

Figure 16:
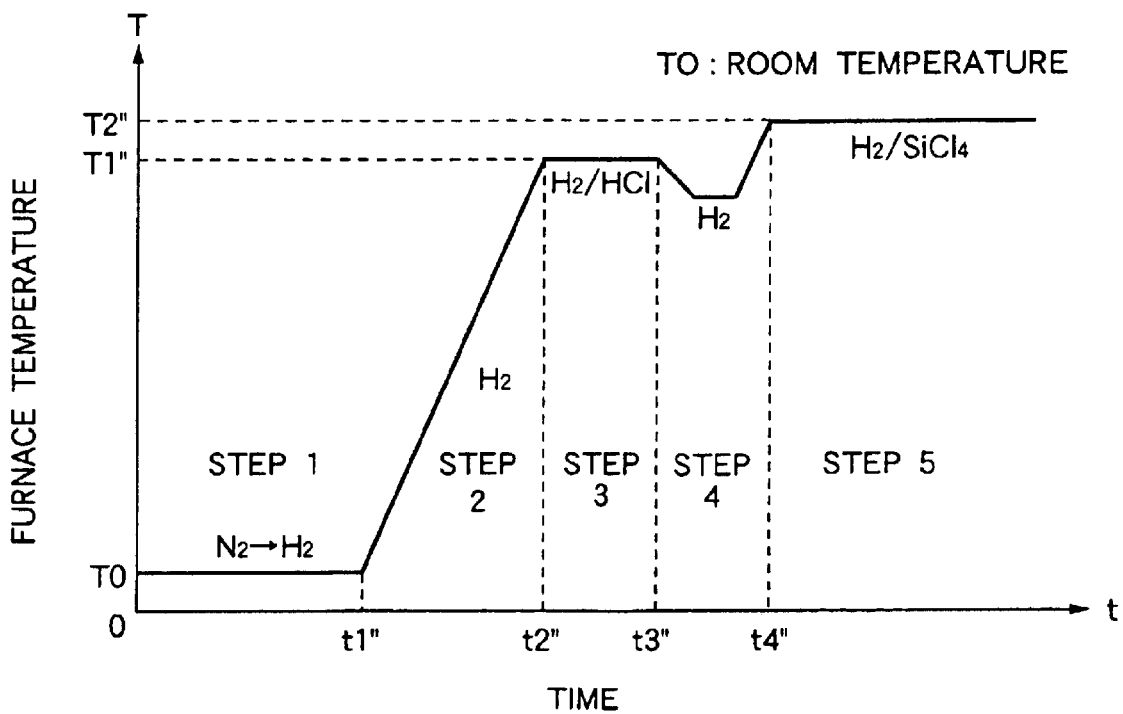
FIG. 16 is a graphical representation showing a variation of temperature in a reactor furnace in a semiconductor fabrication process which is a third embodiment of the present invention.

A semiconductor fabrication process which is a third embodiment of the present invention will be described. FIG. 16 is a graphical representation showing a variation of the temperature in the reactor furnace in the process of this embodiment. This process is the same as the second embodiment until a time point t3". At the time point t3", $H_2$ gas is introduced into the furnace to replace the etching gas with the $H_2$ gas, and the temperature in the furnace is decreased once. Then the furnace temperature is increased again to a temperature T2" (T2">T1") of epitaxial crystallization (step 4). Mixture gas of $H_2$ gas and $SiCl_4$ gas is introduced into the furnace to grow an epitaxial layer 5 on the substrate 1. At the time, T1" is similar to the T1' of the second embodiment. T2" is adjusted to lower than 1200° C. in the condition of T2">T1". $SiHCl_3$ gas may be served as the gas to be mixed with the $H_2$ gas. In the case, T2" is adjusted to lower than 1150° C. in the above condition.

While in the above-mentioned embodiments, an npn transistor is given as an example of the semiconductor device to be fabricated by the fabrication process of the present invention, it should be understood that this is not the only application of the invention and that the invention is applicable to any semiconductor device having a buried layer. The embodiment assumes the use of a p-type substrate, but the process of the invention is also applicable to an n-type substrate and the results obtained are comparable to the case of a p-type substrate.

The process of the invention is also applicable to the preparation of an $n^+$ buried layer using an n-type impurity such as As or Sb. In this case, n-type impurities may be injected either by high-energy ion implantation or by a double-charge method.

As seen from the foregoing description, the semiconductor fabrication process of the present invention has the following useful effects.

In the process of the invention, the region into which impurity ions are implanted is activated and diffused simultaneously in a nonoxidizing atmosphere. Therefore, there is no chance that crystal defects, e.g., OSF (oxide-induced stacking fault), are caused in the substrate surface. Further, no oxide film is formed on the substrate surface in the process of the invention. Hence, the step to remove the oxide film may be omitted.

The epitaxial growing process step starts before the impurity implanted region to be diffused reaches the surface of the substrate. With this unique feature, the spreading of the impurity ion diffusion region does not reach the interface between the epitaxial layer and the substrate, and hence no autodoping problem arises. Therefore, there is a less chance of forming crystal defects in the epitaxial growing process.

The sequence of process steps is executed within one furnace. Therefore, there is no chance that the substrate undergoes the temperature variation cycle of temperature rise and fall (up to room temperature), which essentially occurs when the substrate is taken out of a furnace and put into another furnace in the related process. In the process of the invention, particularly at the start of the epitaxial growing step, a temperature variation of the substrate is extremely small. Formation of crystal defects by the thermal stress is lessened to produce the substrate surface having no crystal defects and being clean. For this reason, the process of the invention can form an epitaxial layer of good film quality.

The process of the invention does not include the steps to take the substrate out of a furnace and putting it into another furnace and hence is free from the temperature variation cycle. Therefore, this feature accrues to reduction of fabrication time and simplification of the fabrication process.

The ion implantation is performed in a state that the $SiO_2$ film is layered on the substrate surface. Therefore, the damage of the substrate surface, which is essentially caused in the process of ion implantation in the related fabrication process, is lessened.

Thus, the semiconductor fabrication process of the invention can fabricate a semiconductor device having a buried layer which is free from the autodoping which otherwise would occur in the region where the buried layer is to be formed, and further from the surface defects.

What is claimed is:

1. A process for fabricating a semiconductor device having a buried layer comprising the steps of:

forming a buried implanted impurity ion region at a location which is spaced below a surface of a substrate where a buried layer is to be formed in the substrate;

placing the substrate inside a reactor furnace and, while maintaining the substrate in the reactor furnace;

providing a nonoxidizing atmosphere inside of the reactor furnace;

annealing the substrate to activate implanted impurity ions by increasing the internal temperature of the reactor furnace up to a first temperature wherein the first temperature does not cause oxide induced stacking fault to occur in the nonoxidizing atmosphere; and before the buried ion implanted region beneath the surface of the substrate expands upwardly sufficiently to reach the surface of the substrate, changing the internal temperature of the reactor furnace from the first temperature to a second temperature of approximately 1,000 Centigrade, during which time the buried implanted impurity ion region diffuses both upwardly and downwardly from the location below the surface of the substrate, so as to allow an epitaxial crystal to start growing on the surface and introducing an epitaxial growth gas into the reactor furnace to cause an epitaxial layer to grow on the surface of the substrate, thereby inhibiting autodoping and formation of crystal defects in the epitaxial layer; and then removing the substrate from the reactor furnace.

2. The process for fabricating the semiconductor device as set forth in claim 1, wherein the first temperature is lower than the second temperature.

3. The process for fabricating the semiconductor device as set forth in claim 1 further comprising the steps of:

providing a cleaning gas in the reactor furnace to clean up the surface of the substrate between the step of diffusing the ion implanted region and the step of growing the epitaxial layer.

4. The process for fabricating the semiconductor device as set forth in claim 3, wherein the first temperature is lower than the second temperature.

5. The process for fabricating the semiconductor device as set forth in claim 3, wherein the first temperature is higher than the second temperature.

6. The process for fabricating the semiconductor device as set forth in claim 1, wherein the surface of the substrate is covered by the oxide film at the step of implanting the impurity ion.

7. The process for fabricating the semiconductor device as set forth in claim 3, wherein the cleaning gas comprises $H_2$ gas.

8. The process for fabricating the semiconductor device as set forth in claim 3, wherein the cleaning gas includes HCl gas.

* * * * *

UNITED STATES PATENT AND TRADEMARK OFFICE
CERTIFICATE OF CORRECTION

PATENT NO.   : 6,884,701 B2  
DATED        : April 26, 2005  
INVENTOR(S)  : Takasu, Hidemi It is certified that error appears in the above-identified patent and that said Letters Patent is hereby corrected as shown below:

Title page,
Insert Item, -- [30] Foreign Application Priority Data:
        (JP)    03-125416        April 27, 1991 --.

Signed and Sealed this

Twentieth Day of September, 2005

JON W. DUDAS
*Director of the United States Patent and Trademark Office*